(12) United States Patent
Shimada

(10) Patent No.: US 7,723,197 B2
(45) Date of Patent: May 25, 2010

(54) METHOD OF MANUFACTURING SEMICONDUCTOR DEVICE AND SEMICONDUCTOR DEVICE

(75) Inventor: Hiroyuki Shimada, Kofu (JP)

(73) Assignee: Seiko Epson Corporation, Tokyo (JP)

( * ) Notice: Subject to any disclaimer, the term of this patent is extended or adjusted under 35 U.S.C. 154(b) by 655 days.

(21) Appl. No.: 11/363,999

(22) Filed: Mar. 1, 2006

(65) Prior Publication Data

US 2006/0223289 A1    Oct. 5, 2006

(30) Foreign Application Priority Data

Mar. 30, 2005    (JP) .............................. 2005-096837
Oct. 24, 2005    (JP) .............................. 2005-308285

(51) Int. Cl.
*H01L 21/336* (2006.01)

(52) U.S. Cl. .................. 438/301; 438/299; 438/795

(58) Field of Classification Search ................. 438/299, 438/301, 795
See application file for complete search history.

(56) References Cited

U.S. PATENT DOCUMENTS

| | | | |
|---|---|---|---|
| 5,940,693 | A | 8/1999 | Maekawa |
| 6,242,779 | B1 | 6/2001 | Maekawa |
| 6,358,828 | B1 * | 3/2002 | Kadosh et al. .............. 438/586 |
| 6,465,847 | B1 * | 10/2002 | Krishnan et al. ............. 257/347 |
| 6,472,282 | B1 | 10/2002 | Yu |
| 6,522,315 | B2 | 2/2003 | Ozawa et al. |
| 6,784,101 | B1 | 8/2004 | Yu et al. |
| 2003/0113960 | A1 | 6/2003 | Chang |
| 2004/0061184 | A1 * | 4/2004 | Lu et al. ...................... 257/384 |
| 2005/0026379 | A1 * | 2/2005 | Kammler et al. ............ 438/303 |
| 2006/0138527 | A1 * | 6/2006 | Bhattacharyya ............. 257/316 |
| 2006/0170051 | A1 * | 8/2006 | Gonzalez ..................... 257/347 |

FOREIGN PATENT DOCUMENTS

| | | |
|---|---|---|
| JP | A 04-073313 | 3/1992 |
| JP | A 05-190449 | 7/1993 |
| JP | A 05-335482 | 12/1993 |
| JP | A 11-097710 | 4/1999 |
| JP | A 11-111634 | 4/1999 |
| JP | B2 3528182 | 3/2004 |
| KR | B1 0128724 | 4/1998 |
| KR | A 2003-0036934 | 6/2003 |
| WO | WO 02/33738 A1 | 4/2002 |

\* cited by examiner

*Primary Examiner*—Bradley K Smith
(74) *Attorney, Agent, or Firm*—Oliff & Berridge, PLC

(57) ABSTRACT

A method of manufacturing a semiconductor device includes implanting an impurity into a crystalline semiconductor film that is formed over a base and includes a first part in contact with the base, a second part and a third part, so that at least the second part and the third part are doped with the impurity while the first part is prevented from being doped with the impurity, and forming a source and a drain in the second part and the third part, respectively. The implanting includes depositing a material of the crystalline semiconductor film over the base. The forming includes heating at least the second part and the third part.

4 Claims, 4 Drawing Sheets

METHOD OF MANUFACTURING SEMICONDUCTOR DEVICE AND SEMICONDUCTOR DEVICE

This application claims the benefit of Japanese Patent Application No. 2005-096837, filed Mar. 30, 2005 and Japanese Patent Application No. 2005-308285, filed Oct. 24, 2005. The entire disclosure of the prior applications is hereby incorporated by reference herein in its entirety.

BACKGROUND

1. Technical Field

The present invention relates to a method of manufacturing a semiconductor device, and a semiconductor device manufactured by the method.

2. Related Art

In electro-optic devices such as liquid crystal displays and organic EL displays, a transparent substrate made of inexpensive glass, resin or the like is used as a substrate. Since the substrate made of such a material has low heat resistance, semiconductor elements including thin-film transistors (TFTs) and various devices integrated on the substrate are normally manufactured by a low-temperature process (Refer, for example, to Japanese Patent No. 3528182).

There are generally strong demands for size reduction and density increase of semiconductor devices equipped with transistors and the like, to achieve a higher definition and so on of electro-optic devices on which the semiconductor devices are mounted for example.

However, in a transistor formed by a typical low-temperature process, the source and drain thereof are formed as an amorphous semiconductor layer because of impurity implantation into them. Therefore, especially in a transistor with a minute size, the parasitic resistance of the source and drain is too large to realize good electrical characteristics of the transistor.

It would also be possible to arrange semiconductor elements such as transistors three-dimensionally in order to achieve a higher density that offers a higher definition. However, when transistors and the like are manufactured on each of multiple semiconductor layers deposited on top of each other, high-temperature heat treatment performed for each layer for activating impurities gives semiconductor elements on other layers, a thermal history above the maximum temperature employed in normal process design for the semiconductor elements. This problem makes process design very difficult and complex, precluding use of e.g. a heat-sensitive salicide process.

SUMMARY

An advantage of some aspects of the invention is to provide a method of manufacturing a semiconductor device, allowing production of transistors having good electrical characteristics, to thereby achieve size miniaturization and density increase of semiconductor devices, and allow the transistors to be arranged three-dimensionally. Another advantage of some aspects of the invention is to provide a semiconductor device manufactured by the method.

A method of manufacturing a semiconductor device according to one aspect of the invention includes implanting an impurity into a crystalline semiconductor film that is formed over a base and includes a first part in contact with the base, a second part and a third part, so that at least the second part and the third part are doped with the impurity while the first part is prevented from being doped with the impurity, and forming a source and a drain in the second part and the third part, respectively. The implanting includes depositing a material of the crystalline semiconductor film over the base. The forming includes heating at least the second part and the third part.

A method of manufacturing a semiconductor device according to another aspect of the invention includes implanting an impurity into a crystalline semiconductor film that is formed over a base and includes a first part, a second part and a third part, so that at least the second part and the third part are doped with the impurity while the first part is prevented from being doped with the impurity, and forming a source and a drain in the second part and the third part, respectively. The forming includes heat treatment for at least the second part and the third part to enhance the crystallinity of the second part and the third part.

A method of manufacturing a semiconductor device according to further another aspect of the invention includes implanting an impurity into a crystalline semiconductor film that is formed over a base and includes a first part, a second part and a third part, so that at least the second part and the third part are doped with the impurity while the first part is prevented from being doped with the impurity, and forming a source and a drain in the second part and the third part, respectively. The forming includes heat treatment for at least the second part and the third part to induce solid phase epitaxy in the second part and the third part with using at least part of the first part as a seed.

In the above-described manufacturing methods, the source and drain are formed through activation of an impurity by, for example, solid phase epitaxy using at least part of the first part, which is part of the crystalline semiconductor layer, as a seed. Therefore, the impurity is diffused at a relatively low temperature to enter the primary effective sites, and thus the source and drain are activated in an electrically favorable manner, which provides the transistor with good electrical characteristics. Also, the solid phase epitaxy crystallizes the semiconductor layer forming the source/drain, thereby reducing the parasitic resistances of the source/drain and improving the electrical characteristics of the transistor.

In the above manufacturing method, it is preferable that the heating for at least the second part and the third part is performed at a temperature within the range of 350° C. through 550° C.

Implementation of the solid phase epitaxy at such a temperature allows favorable formation of the source/drain. In addition, other components are prevented from being given any thermal history above the maximum temperature employed in normal process design for the components.

It is also preferable that the above manufacturing method further includes forming a gate electrode made of a metal over the crystalline semiconductor film with the intermediary of a gate insulation film therebetween.

Thereby, impurity implantation into the gate electrode and channel region and activation of the impurities become unnecessary. Thus, it is surely avoided that a high-temperature heat treatment for such activation gives other components any thermal history above the maximum temperature employed in normal process design for the components.

Preferably, the above manufacturing method further includes forming a metal layer on the source and the drain and then implementing heat treatment, so that surface part of the source and the drain is turned into silicide.

Such a process reduces the parasitic resistance of the source/drain and thus improves the electrical characteristics of the transistor.

It is preferable that, in the manufacturing method, the heat treatment for turning the surface part into silicide is performed at a temperature within the range of 350° C. to 550° C. Such a range of temperature avoids giving other components any thermal history above the maximum temperature employed in normal process design for the components.

Preferable silicides to be formed at such a temperature include nickel monosilicide (NiSi), whose resistivity of about 20 μΩ·cm is low enough to achieve a sufficiently low parasitic resistance of the source/drain.

It is also preferable that, in the manufacturing method, a substrate having a transistor thereon is used as the base, so that transistors are three-dimensionally arranged over the substrate.

Particularly, as the source and drain are formed at a low temperature such as 550° C. or less by solid phase epitaxy, no transistor over the base is given any thermal history above the maximum temperature employed in normal process design for the transistors. Thus, it is allowed to three-dimensionally arrange transistors over the substrate to achieve density increase of transistors.

A semiconductor device including a transistor over a base according to still another aspect of the invention includes a crystalline semiconductor layer formed over the base by a deposition method, and a source and a drain formed in the crystalline semiconductor layer through activation of an impurity by solid phase epitaxy using part of the crystalline semiconductor layer near the base as a seed layer.

The semiconductor device is provided with a source and a drain through activation of an impurity caused by solid phase epitaxy using part of the crystalline semiconductor layer as a seed layer. Therefore, as described above, the source and drain are activated in an electrically favorable manner, which provides the transistor with good electrical characteristics. Furthermore, the solid phase epitaxy crystallizes the semiconductor layer forming the source/drain, and thus reduces the parasitic resistance of the source/drain and improves the electrical characteristics of the transistor.

BRIEF DESCRIPTION OF THE DRAWINGS

The invention will be described with reference to the accompanying drawings, wherein like numbers reference like elements.

DESCRIPTION OF EXEMPLARY EMBODIMENTS

A method of manufacturing a semiconductor device according to one embodiment of the invention will now be described below.

The present embodiment relates to a manufacturing method for a semiconductor device having a three-dimensional structure formed by arranging transistors three-dimensionally over a substrate. Particularly, the method employs a quartz substrate on which transistors are formed by a low-temperature process employing temperatures not exceeding 550° C. In the present embodiment, a substrate made of quartz is used as the base of the invention.

Figure 1A:
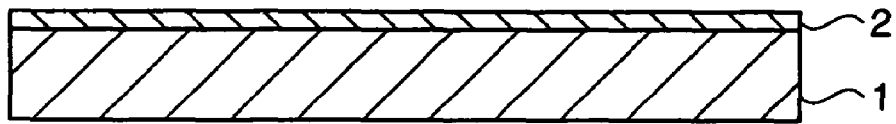
FIGS. 1A through 1D illustrate a process for manufacturing a semiconductor device according to one embodiment of the invention.
Figure 1B:
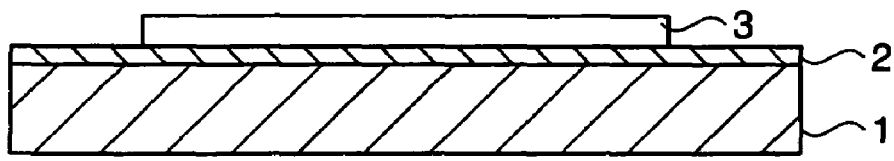

Referring initially to FIG. 1A, a substrate (base) 1 made of quartz is prepared, on which an oxide silicon film is formed as an underlying insulation film 2. Then, as shown in FIG. 1B, an island-like crystalline silicon layer (semiconductor layer) 3 which is about 50 nm thick is formed by a deposition method on the underlying insulation film 2. For forming this silicon layer 3, a plasma CVD method, for example, is used to form an amorphous silicon layer. The amorphous silicon layer is then turned to a polycrystalline layer by irradiation of an excimer laser to form a polysilicon layer, which is a crystalline layer. Alternatively, a thermal CVD method using disilane, for example, is employed to deposit amorphous silicon at a temperature of about 425° C. When this amorphous silicon is irradiated with an excimer laser, single crystal silicon of very large grains is formed as a crystalline silicon layer. Deposition methods for forming the crystalline silicon layer 3 include sputtering and evaporation, in addition to CVD.

After that, island-like patterning of the silicon layer using photolithography forms the island-like silicon layer 3.

Figure 1C:
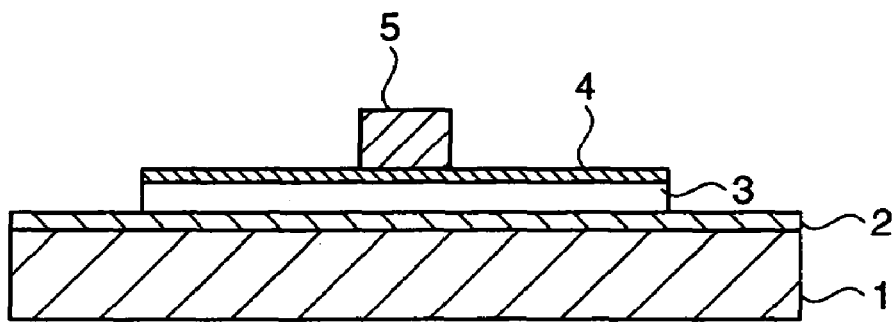

After the island-like crystalline silicon layer 3 is thus formed, plasma oxidation is implemented using oxygen and krypton and employing the following conditions: a gas flow ratio (volume ratio) $O_2$:Kr of 3:97, a pressure of 1 torr, power of 3 kWh, and a substrate temperature of 400° C. As shown in FIG. 1C, an $SiO_2$ layer is thereby formed in a thickness of about 5 nm on the surface of the silicon layer 3. This $SiO_2$ layer serves as a gate insulating film 4.

Then, by sputtering using xenon gas, films of tantalum nitride, tantalum metal, and again tantalum nitride are deposited on top of each other in that order to form a metal layer made of three layers. Then, the metal layer is patterned by photolithography to form a gate electrode 5 composed of this metal layer.

Figure 1D:
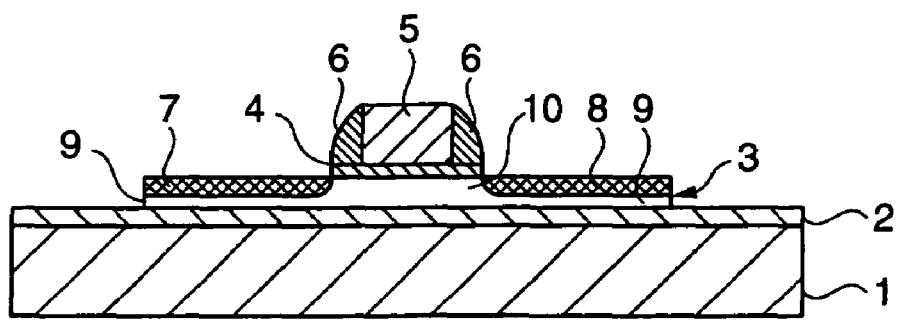

Next, as shown in FIG. 1D, side walls 6 are formed on both sides of the gate electrode 5. For this formation, an oxide silicon layer is formed by a method such as CVD, and then anisotropic etching is performed on the layer. This etching selectively leaves the gate insulating film 4 only under the gate electrode 5 and side walls 6, and removes the film 4 formed on other regions.

Then, using the gate electrode 5 and the side walls 6 as a mask, an impurity is implanted into a second part (not illustrated) and a third part (not illustrated) in the silicon layer 3, thereby forming a source forming area 7 and a drain forming area 8. An ion implantation method such as ion doping is adopted for this impurity implantation. When the impurity is thus implanted in embodiments of the invention, a bottom region of the silicon layer 3, namely a region near the substrate 1, is partly left as a non-doped region to be used as a seed layer 9. Specifically, the impurity is not implanted into this seed layer 9 but selectively implanted into regions above the layer 9, whereby the source forming area 7 and the drain forming area 8 are formed. This portion used as the seed layer 9 is the first part of the invention.

More specifically, the energy for implanting the impurity is appropriately controlled so that the impurity is not implanted into the bottom region of the silicon layer 3. This impurity implantation turns the source forming area 7 and the drain forming area 8 to an amorphous state from the original single-crystal or polycrystalline state. The bottom region that remains as the crystalline silicon layer 3 without being doped with the impurity is used as the seed layer 9.

The seed layer 9 is formed to have a thickness of at least 10 nm between the bottom face thereof in contact with the substrate 1 and the top face thereof in contact with the source forming area 7 and the drain forming area 8. When the impurities are activated by solid phase epitaxy to be described later, such a thickness of the seed layer 9 allows favorable solid phase epitaxial growth in the source forming area 7 and the drain forming area 8 with the seed layer 9 being used as the nucleation, and thus allows recrystallization of the source forming area 7 and the drain forming area 8.

The implantation energy for forming the source forming area 7 and the drain forming area 8 is, for example, about 2 keV for boron and 6 keV for phosphor. The implantation dosage is about $1.5 \times 10^{15}/\text{cm}^2$. As to the conductivity type of the impurity to be implanted, a P-type impurity is normally used for fabrication of an N-type transistor, and an N-type impurity for a P-type transistor. However, the type of the impurity is not limited thereto, but may be appropriately determined depending on design of threshold value of the transistor.

The part of the silicon layer 3 directly underneath the gate electrode 5 and side walls 6 is either an intrinsic semiconductor region with no impurity or a very-lightly-doped region with trace dopants. Such an intrinsic semiconductor region or a very-lightly-doped region forms a channel region 10.

Figure 2A:
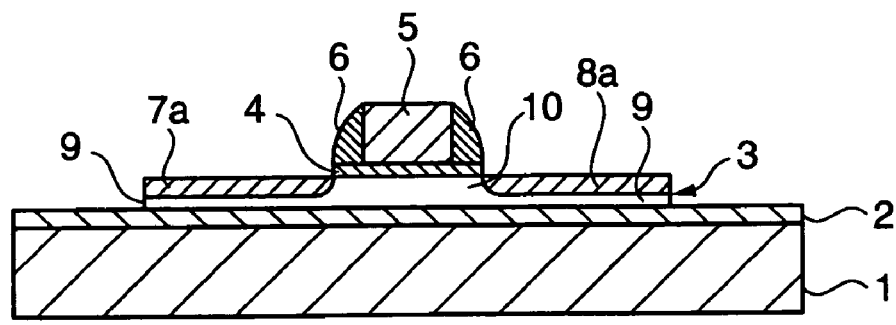
FIGS. 2A through 2C illustrate the process for manufacturing a semiconductor device according to the embodiment.

Next, the substrate 1 is placed in a calcinator and heated, for example, in an argon atmosphere for 1 to 5 hours at a temperature within the range of 350° C. to 550° C. to thereby induce solid phase epitaxy in the source forming area 7 and the drain forming area 8 with using the seed layer 9 as the nucleation (seed), and cause therein solid phase epitaxial growth. In the present embodiment, the heating is implemented for 1 hour at 550° C. Through the solid phase epitaxial growth (solid phase epitaxy) induced in such a manner, the implanted impurities are diffused and activated at a relatively low temperature to enter the primary effective sites. The source forming area 7 and the drain forming area 8 are thereby turned into a source 7a and a drain 8a, as shown in FIG. 2A.

In addition, the source forming area 7 and the drain forming area 8, which have been turned to amorphous, recover their crystalline state. As described above, they recrystallize using the crystalline seed layer 9 as the nucleation to become the source 7a and the drain 8a. Here, the activation of impurities and recrystallization by means of solid phase epitaxy is performed at 550° C. (350 to 550° C.). Therefore, even if there are other components such as semiconductor elements over the substrate 1, they are not given any thermal history above the maximum temperature employed in normal process design for the components.

Then, using sputtering or another deposition method, a nickel film is formed, on which further a titanium nitride film is deposited. Then, annealing is carried out by heating at a temperature within the range of 350° C. to 550° C., e.g. 400° C. in the present embodiment, to thereby turn the surface part of the source 7a and the drain 8a into silicide. This silicidation by heating with such a temperature leads to the formation of a silicide layer 11 made of nickel monosilicide (NiSi) in the surface part of the source 7a and the drain 8a. Since this silicide layer 11 made of nickel monosilicide has a low electric resistivity of about 20 μΩ·cm, the parasitic resistances of the source 7a and the drain 8a are adequately small.

Figure 2B:
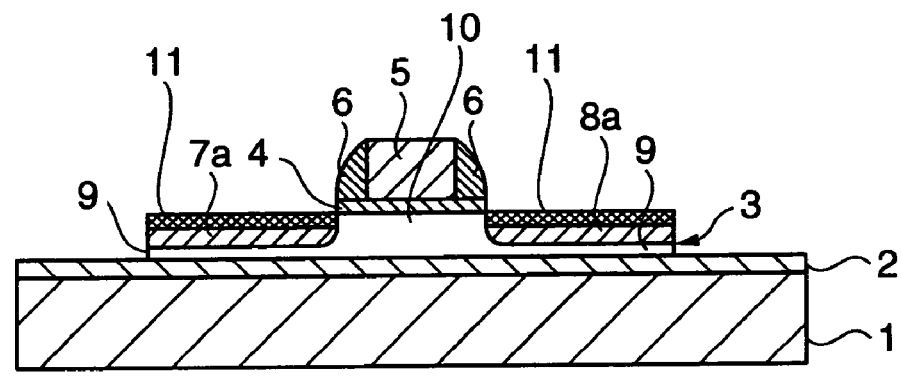
Figure 2C:
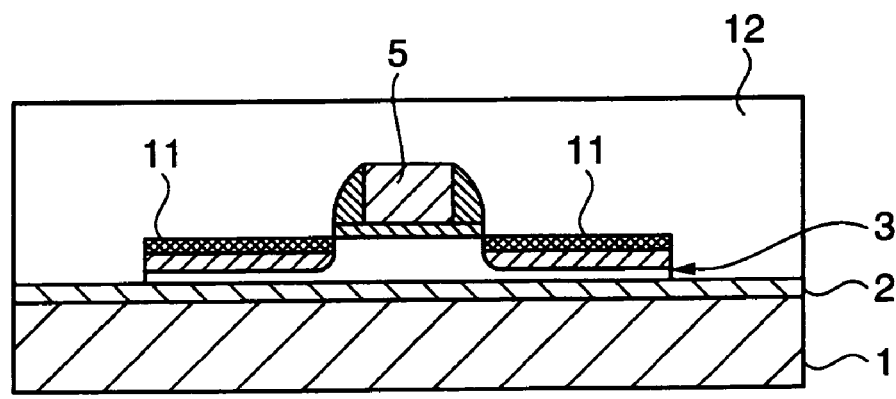

After that, as shown in FIG. 2 B, the unreacted nickel film and titanium nitride film, on regions other than the formation region of the suicide layer 11 made of nickel monosilicide, are selectively removed by wet etching.

Next, as shown in FIG. 2 C, an oxide silicon film is formed to cover the silicide layer 11 and the gate electrode 5 so as to form an interlayer insulation film 12.

Figure 3A:
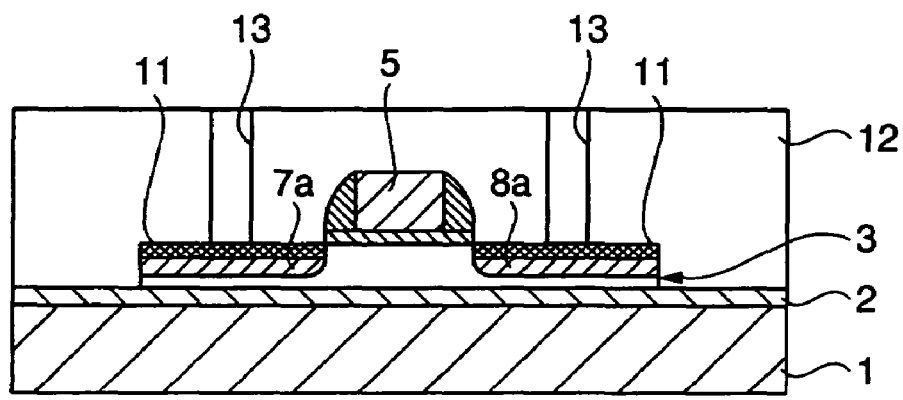
FIGS. 3A and 3B illustrate the process for manufacturing a semiconductor device according to the embodiment.

Then, as shown in FIG. 3A, formed by photolithography are two contact holes 13 that run through the interlayer insulation film 12 to reach the silicide layers 11 of the source 7a and the drain 8a.

Figure 3B:
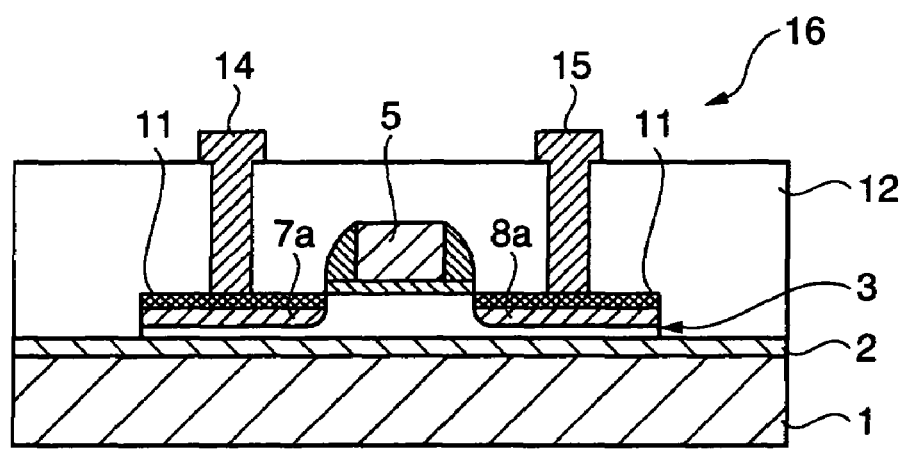

Subsequently, a multilayer film of, for example, Ti/Al/Ti is formed on the interlayer insulation film 12 by a film-forming method such as sputtering. Subsequent patterning of the multilayer film by photolithography forms a source electrode 14 and a drain electrode 15, as shown in FIG. 3B, thus completing a transistor (thin-film transistor) 16.

In the transistor 16 thus obtained, the impurities in the source 7a and the drain 8a have been activated by the solid phase epitaxy using part of the silicon layer 3 as the seed layer 9. Therefore, the source 7a and the drain 8a are electrically well activated to allow production of a transistor with good electrical characteristics.

Also, since the silicon layers forming the source 7a and the drain 8a have been recrystallized by the solid phase epitaxy, their parasitic resistance is low. This low parasitic resistance enhances the electrical characteristics of the transistor. Furthermore, the silicide layer 11 made of nickel monosilicide has been formed at the source 7a and the drain 8a through silicidation. This provides a sufficiently low parasitic resistance of the source 7a and the drain 8a, further improving thereby the electrical characteristics of the transistor.

Figure 4A:
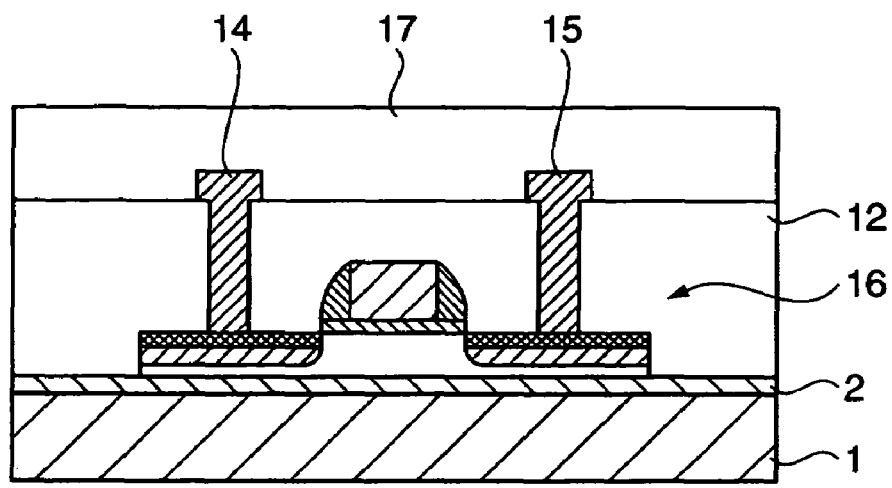
FIGS. 4A and 4B illustrate the process for manufacturing a semiconductor device according to the embodiment.

The present embodiment produces a semiconductor device having a three-dimensional structure, by three-dimensionally arranging the transistors 16 thus formed. Specifically, the interlayer insulation film 17 made of oxide silicon or the like is formed on the transistor 16, as shown in FIG. 4A.

Figure 4B:
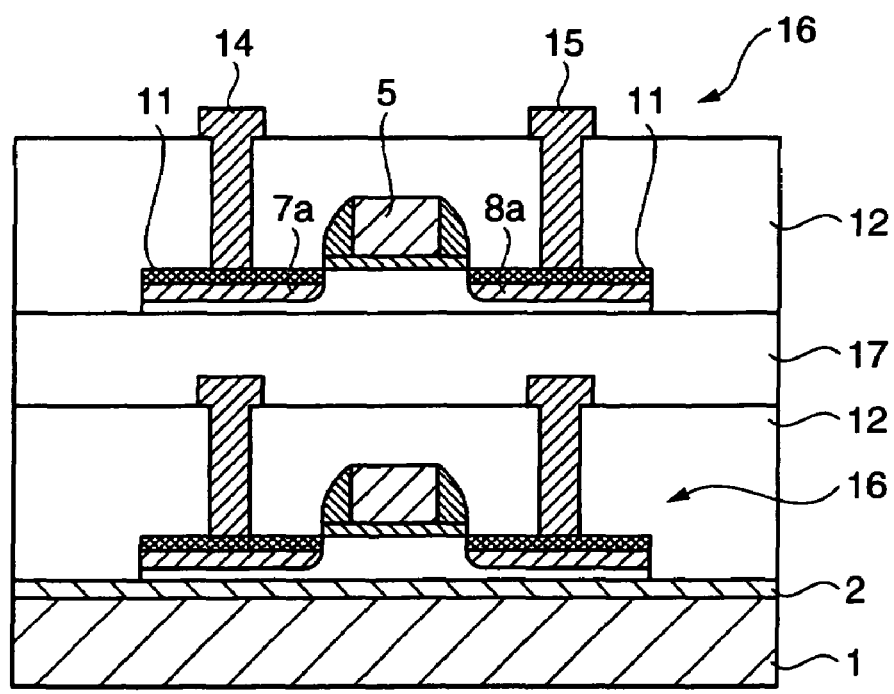

Then, as shown in FIG. 1B, the island-like silicon layer 3 is formed on the interlayer insulation film 17. Subsequently, the steps shown in FIG. 1C, FIGS. 2A to 2C, FIGS. 3A and 3B are repeated to provide another transistor 16 having the same structure over the transistor 16 described above, as shown in FIG. 4B.

In the formation of such an upper transistor 16, the source 7a and the drain 8a are formed by solid phase epitaxy that uses a temperature within the range of 350° C. to 550° C. Thus, adequate formation of the source 7a and the drain 8a is allowed, while no thermal history above the maximum temperature employed in normal process design is given to other components such as the source 7a and the drain 8a of the lower transistor 16.

Moreover, since the heat treatment in the silicidation to form the silicide layer 11 is also implemented using a temperature within the range of 350° C. to 550° C., no thermal history above the maximum temperature employed in normal process design is given to other components such as the source 7a and the drain 8a of the lower transistor 16.

It is also feasible to further repeat the same manufacturing process and thereby sequentially provide other transistors 16 as a third layer transistor, a fourth layer transistor, and so on, to obtain a highly integrated three-dimensional semiconductor device.

In the three-dimensional semiconductor device thus obtained, a sufficiently high density is achieved through integration while direct three-dimensional contact is allowed between upper and lower semiconductor layers. Therefore, much shorter interconnects are allowed than interconnects in a related-art semiconductor device. As a result, the wiring delay time is significantly reduced and a semiconductor device with enhanced performance becomes available without resort to miniaturization. Applying this semiconductor device to e.g. an electro-optic device allows the electro-optic device to achieve high-definition displaying and other advantages.

The invention is not limited to the above-described embodiment. Various changes and modifications can be made as far as they do not depart from the intention and spirit of the invention. For example, the above-described embodiment uses a substrate made of quartz as the base of the invention, but an SOI substrate or a silicon substrate may be used as well. When an SOI or silicon substrate is used, the lowest semiconductor element (transistor) may be produced by a process using a high-temperature polysilicon film in place of the above process using a so-called low-temperature polysilicon film, because when the lowest element is fabricated, there are no components of other elements over the substrate. Over the lowest semiconductor element (transistor) thus formed, other transistors 16 are formed by the above-described method. When the method using a high-temperature polysilicon film is employed for the lowest semiconductor element (transistor), a portion including a substrate made of an SOI substrate or a silicon substrate and the lowest semiconductor element formed thereon, is used as the base of the invention.

What is claimed is:

1. A method of manufacturing a semiconductor device, the method comprising:
    forming a crystalline semiconductor film above a substrate, the crystalline semiconductor film including a first portion, a second portion, and a third portion, the first portion being positioned between the second portion and the third portion;
    forming a gate electrode above the first portion;
    applying an impurity to the second portion and the third portion using the gate electrode as a mask such that the second portion and the third portion are confined to have an impurity doped region and an impurity non-doped region, respectively, the impurity non-doped region being positioned between the impurity doped region and the substrate;
    heating the impurity at a temperature within a range of 350° C. to 550° C. to induce a solid phase epitaxy using the impurity non-doped region as a seed such that the impurity doped region recovers a crystalline state, the second portion forming a first source region and the third portion forming a first drain region;
    forming a nickel film on the first source region and the first drain region after the heating of the impurity;
    forming a titanium nitride film on the nickel film; and
    conducting an annealing at a temperature within a range of 350° C. to 550° C. to turn a surface of the first source region and the first drain region into a silicide.

2. The method of manufacturing the semiconductor device according to claim 1, further comprising forming a pair of sidewalls on the gate electrode before the applying of the impurity.

3. The method of manufacturing the semiconductor device according to claim 1, further comprising:
    forming an insulating film above the first source region, the gate electrode, and the first drain region;
    forming a first contact hole in the insulating film such that the first contact hole reaches the first source region;
    forming a second contact hole in the insulating film such that the second contact hole reaches the first drain region;
    forming a first source electrode above the insulating film and in the first contact hole, the first source electrode being electrically connected to the first source region; and
    forming a first drain electrode above the insulating film and in the second contact hole, the first drain electrode being electrically connected to the first drain region.

4. The method of manufacturing the semiconductor device according to claim 3, further comprising:
    forming another semiconductor film above the insulating film; and
    forming a second source region and a second drain region by a same process used to form the first source and drain regions.

* * * * *